United States Patent [19]

McCollum

[11] Patent Number: 5,057,451
[45] Date of Patent: Oct. 15, 1991

[54] METHOD OF FORMING AN ANTIFUSE ELEMENT WITH SUBSTANTIALLY REDUCED CAPACITANCE USING THE LOCOS TECHNIQUE

[75] Inventor: John L. McCollum, Saratoga, Calif.
[73] Assignee: Actel Corporation, Sunnyvale, Calif.
[21] Appl. No.: 508,303
[22] Filed: Apr. 12, 1990
[51] Int. Cl.[5] ............................................. H01L 21/76
[52] U.S. Cl. ...................................... 437/69; 437/919; 437/922; 437/979; 437/985; 148/DIG. 14; 148/DIG. 55; 148/DIG. 116; 148/DIG. 117; 148/DIG. 141
[58] Field of Search ................. 437/228, 239, 186, 919, 437/922, 985, 979, 69; 148/DIG. 14, DIG. 55, DIG. 116, DIG. 117, DIG. 141

[56] References Cited
U.S. PATENT DOCUMENTS

| | | | |
|---|---|---|---|
| 4,394,181 | 7/1983 | Nicholas | 437/41 |
| 4,441,247 | 4/1984 | Gargini et al. | 437/41 |
| 4,574,465 | 3/1986 | Rao | 437/919 |
| 4,823,181 | 4/1989 | Mohsen et al. | |
| 4,866,001 | 9/1989 | Pickett et al. | 357/35 |
| 4,981,813 | 1/1991 | Bryant et al. | 437/69 |

FOREIGN PATENT DOCUMENTS

| | | | |
|---|---|---|---|
| 140643 | 11/1981 | Japan | 437/69 |
| 37849 | 3/1982 | Japan | 437/69 |
| 44748 | 3/1983 | Japan | 437/69 |

Primary Examiner—Brian E. Hearn
Assistant Examiner—Linda J. Fleck
Attorney, Agent, or Firm—Kenneth D'Alessandro

[57] ABSTRACT

A minimum sized aperture for a reduced capacitance anti-fuse or other structure may be formed by birds beak encroachment of thick oxide under a masking layer or by isotropic etching of a masking layer followed by birds beak encroachment of thick oxide.

7 Claims, 6 Drawing Sheets

METHOD OF FORMING AN ANTIFUSE ELEMENT WITH SUBSTANTIALLY REDUCED CAPACITANCE USING THE LOCOS TECHNIQUE

BACKGROUND OF THE INVENTION

1. Field of the Invention

This invention relates to electrically programmable semiconductor memory devices and methods of manufacture thereof, and particularly to a method for manufacturing an electrically programmable antifuse with substantially reduced capacitance by forming a minimum size aperture in a semiconductor material for containing the antifuse dielectric, the aperture having a cross section less than the conventional minimum photolithographic feature size.

Integrated logic circuits which can be configured or programmed by the user for a specific application are becoming increasingly popular. These circuits are called programmable read only memory (PROM) circuits and are programmed by either selectively breaking or creating a series of programmable links. Programmable links are electrical interconnects which are broken or created as selected electronic nodes in the circuit by the user after the integrated circuit device has been fabricated and packaged. Such programming is undertaken in order to activate or deactivate, respectively, selected electronic nodes such that a PROM device may be programmed to perform a desired function.

Fusible links formerly were used extensively in PROM devices and are well known. A PROM device usually consists of an X-Y matrix or lattice of conductors or semiconductors. At each cross-over point of the lattice, a conducting link connects a transistor or other electronic node to the lattice network. The PROM device is programmed by providing a high programming current to predesignated fusible links which connect to selected nodes. Links are then blown out to create an open circuit. The combination of blown and unblown fusible links represents a digital bit pattern of ones and zeros signifying the logic configuration which the user wishes to store in the PROM device.

Fusible links present several disadvantages in terms of excessive power dissipation needed for developing the relatively high programming voltages. Fusible link memory cells also present problems in terms of excessive size and concomitantly reduced memory capacity. A fusible like cell must be disadvantageously large in order to accommodate the fusible link and an associated selection transistor which develops the high current needed to blow the link. Fusible links therefore take up an excessively large amount of valuable space on a semiconductor die.

In order to overcome the foregoing disadvantages of fusible links, another type of programmable link, called an antifuse link, has been developed for use in integrated circuit applications. Instead of a programming mechanism for causing an open circuit as is the case with the fusible link, the programming mechanism for an antifuse creates a short circuit or a relatively low resistance link. Antifuse links consist typically of two conductor and/or semiconductor electrodes separated by some kind of dielectric or insulating material.

In programming, the dielectric at a selected point between the electrodes is broken down by a current developed from a predetermined programming voltage applied to the electrodes of selected antifuse links to thereby form a conductive filament electrically connecting the electrodes and forming a closed circuit or relatively low resistance link.

Antifuse elements such as those disclosed in U.S. Pat. No. 4,823,181 are extremely useful in PROM devices due to their extremely small size. All that is required in forming an effective antifuse is that the dielectric layer between the two electrodes, when disrupted by a high electric field, will facilitate the flow of electrons from one of the two electrodes to produce a conductive filament during breakdown of the dielectric. The size of the conductive filament is generally a function of the programming voltage pulse and the composition of the dielectric structure of the antifuse. Typically, the radius of the conductive filament may be in a range of from 0.02 microns to 0.2 microns.

In a PROM device consisting of a matrix of antifuse elements, it is crucial to minimize the capacitance of unprogrammed antifuses. Each unprogrammed antifuse essentially consists of a capacitor, that is, two electrodes separated by a dielectric material. Therefore, a plurality of unprogrammed antifuses on a single line of the matrix will act as a plurality of capacitors connected in parallel, wherein the capacitance of the line will be the sum of the capacitances of all unprogrammed antifuses. Accordingly, if the total capacitance of a plurality of unprogrammed antifuses in a PROM or logic device is large enough, it will severely slow down data signals and greatly impair device operation. It is therefore essential to minimize the capacitance of each antifuse element in order to insure proper device operation.

2. The Prior Art

In the prior art, the minimum size of an antifuse was severely limited by the constraints of the conventional photolithographic process. For example, the most effective way to substantially reduce or minimize capacitance in an antifuse element is to reduce the cross sectional area of the dielectric. In the prior art, the minimum size of an aperture for containing an antifuse dielectric could only be made as small as a conventional photolithographic feature size would allow.

An antifuse may be conventionally fabricated as part of a standard CMOS masking process by first forming an N+ diffusion region in a semiconductor substrate. The N+ region defines a first electrode. A silicon dioxide layer is then formed over the substrate and N+ region. In order to produce an aperture for the antifuse dielectric, an aperture is to be formed in the silicon dioxide layer over the N+region. Using conventional photolithographic techniques, a masking resist is generally placed over the silicon dioxide and a hole is generated in the resist masking area. Next the silicon dioxide is etched out. This results in the resist aperture being larger than the feature size on the glass masking plate due to lateral encroachment of the light during exposure of the mask. In addition, during etching, the undercutting of material by the etchant contributes to creating a larger sized aperture. Also, the aperture in the silicon dioxide is even larger than aperture image in the resist. Accordingly, in the prior art it was not possible to create an aperture for the antifuse dielectric having a size smaller than the minimum feature size. As a result of processing, the aperture would always be larger than the minimum feature size of the mask pattern in the overlying semiconductor layers.

As antifuse dimensions become smaller, the feature size of the resist masking layers must also be decreased. However, there is a lower limit to photolithographic feature sizes beyond which it is impossible to achieve smaller size due to the constraints inherent in conventional photolithography. This is often referred to as the "minimum feature size."

The inability of the prior art to provide a method for forming an antifuse aperture smaller than the minimum photolithographic feature size is a serious constraint to the use of antifuses. Because of this structure, antifuses can be made smaller than will ever be possible using conventional photolithography. For example, an antifuse needs to be only a few hundred angstroms in diameter. Currently, the minimum size of an antifuse is on the order of one micron. This relatively large size is due to the constraints upon minimum geometries which are inherent in conventional photolithography techniques. As a result, antifuses formed by conventional photolithographic techniques usually have disadvantageously large parasitic capacitance in their unprogrammed state. This tends to degrade the speed performance of circuits containing them.

Accordingly, there is a great need for a method for making an aperture for an antifuse as small as possible. Ideally there is a great need for a method for making an antifuse having a diameter of only a few hundred angstroms. This would provide the advantage of potentially eliminating the parasitic capacitance of unprogrammed antifuses.

Accordingly, it is an object of the present invention to provide an electrically programmable low impedance antifuse element having a cross-sectional area smaller than is possible through conventional photolithographic techniques.

It is another object of the present invention to provide a method for producing a minimum size aperture, smaller than is possible thorough conventional photolithographic process steps for forming an antifuse.

It is yet another object of the present invention to provide a method for forming an antifuse having a cross-sectional area smaller than a minimum photolithographic feature size currently allowed, such that a matrix of such minimum geometry antifuses provides only negligible parasitic capacitance.

Another object of the present invention is to provide a method for making an antifuse having a minimum cross section smaller than that obtainable by conventional photolithographic process steps but which is manufacturable using available semiconductor processing techniques.

SUMMARY OF THE INVENTION

In order to overcome the above discussed disadvantages of conventional photolithographic techniques for making apertures for antifuses, the present invention provides a method of making an antifuse aperture smaller than that which can presently be achieved using conventional minimum photolithographic feature sizes. The present invention also provides a method wherein each process step results in a progressively smaller aperture such that an antifuse dielectric formed therein provides only a negligible parasitic capacitance which does not affect the speed of logic gates.

The method for forming a minimum sized aperture smaller than allowable through conventional photolithographic process steps for an antifuse element according to the present invention includes the steps of: providing an N+ region in a semiconductor substrate body for defining a first electrode; providing a silicon dioxide layer over the N+ region; providing a silicon nitride layer overlying the silicon dioxide layer; forming a silicon nitride pad from the silicon nitride layer by exposing a layer of resist for defining the silicon nitride pad and etching the silicon nitride such that the resulting silicon nitride pad is smaller than the resist pattern defining the pad; growing an silicon dioxide layer over the N+ region such that the silicon dioxide layer forms an silicon dioxide bird's beak encroachment underneath the silicon nitride pad; and removing the silicon nitride pad. The antifuse dielectric material may then be deposited in the aperture and the fabrication of the antifuse is completed by providing a conductive layer over the dielectric material.

In a preferred embodiment, the resist pad can be implemented using two separate masks of intersecting stripes or rectangular layers of silicon nitride.

In another embodiment, the step of forming an silicon dioxide bird's beak encroachment under the silicon nitride to form a minimum size aperture is preceded by using either an isotropic plasma etch or hot phosphoric wet etch to undercut the masking silicon dioxide layer. It will be appreciated that this method would form a silicon nitride pad smaller than the feature size of the conventional masking silicon dioxide layer. The encroaching silicon dioxide is then grown. After the silicon nitride pad is removed, only a small aperture is created. This aperture may have an area on the order of 0.01 square microns or less.

In another embodiment, a layer of polycrystalline silicon may be formed over the thin silicon dioxide layer. A layer of silicon nitride is then formed over the layer of polycrystalline silicon. The silicon nitride is masked and etched to form a silicon nitride pad. The polysilicon is then undercut underneath the silicon nitride pad using a isotropic plasma polysilicon etch or polysilicon wet etch. Silicon dioxide is then grown over the N+ region and encroaches beneath the polysilicon feature. The silicon nitride pad and polysilicon are then removed and the silicon dioxide is removed by a wet chemical etching process according to conventional techniques to form a minimum geometry aperture in the middle of the silicon dioxide encroachment. This embodiment may also utilize two masking layers to form the silicon nitride pad from two intersecting stripes or sections of silicon nitride so that the resist on the silicon nitride pad would not be as readily subject to falling off during processing.

An additional embodiment includes forming an silicon dioxide layer over the N+ region. A layer of negative resist is then applied, exposed and developed above the silicon dioxide layer. A layer of evaporated aluminum or other suitable masking material is deposited over the negative resist. The aluminum masking layer is plasma etched to form a small aluminum pad. The negative resist underneath the aluminum pad is undercut using an isotropic etching step. The negative resist can then be used to etch the silicon dioxide in anhydrous HF. This cuts through the silicon dioxide layer leaving a minimum size aperture in the silicon dioxide layer for placement of the antifuse dielectric. Again, this embodiment could incorporate the step of forming the aluminum layer from two intersecting stripes of aluminum so that the resist pad would not be susceptible to breaking off during the processing operation.

An alternate embodiment of the method according to the present invention for forming an aperture smaller than a minimum photolithographic feature size is provided wherein an N+ region is implanted around a minimum size masking structure. The N+ region is then side diffused under the masking structure. The N+ region is then oxidized by growing a silicon dioxide layer in low temperature steam. Because of the preferential oxide growth over the N+ region, the bird's beak silicon dioxide encroachment beneath the masking layer will have a sharper transition. At this point, the masking layer is removed and an enhanced concentration of N+ impurity is implanted into the aperture region at the thinnest portion of the bird's beak encroachment. This embodiment also could include a masking layer formed from two intersecting stripes of masking material such that the masking layer would be less likely to fall off the device during processing.

DETAILED DESCRIPTION OF THE PREFERRED EMBODIMENT

Figure 1A:
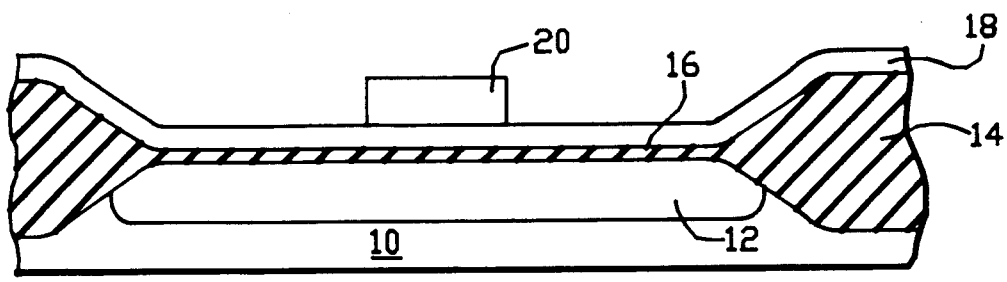
FIGS. 1a, 1b, 1c are sectional views of an antifuse device made in accordance with the method of the present invention at various stages in the manufacture thereof.
Figure 1B:
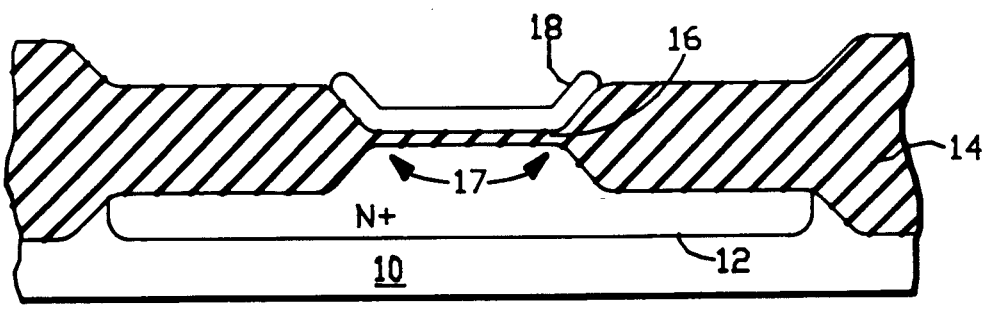
Figure 1C:
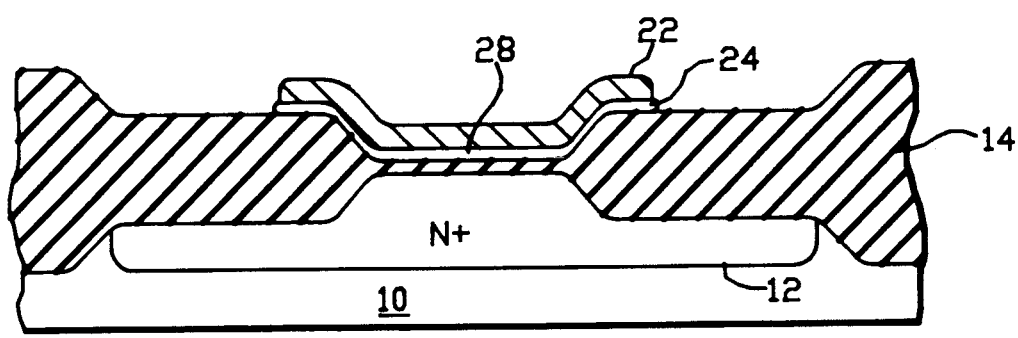

Referring to FIGS. 1a-1c, an antifuse device manufactured in accordance with the present invention may have a minimum size aperture for receiving an antifuse dielectric material which is smaller than a minimum photolithographic feature size which is conventionally possible.

Referring first to FIG. 1a, the antifuse of the present invention may be formed on a silicon substrate or polysilicon layer 10. Initially, an N+ diffusion region 12, which serves as the lower electrode of the antifuse is formed in a semiconductor substrate 10 in an area between conventional field oxide regions 14. Those of ordinary skill in the art will readily recognize that substrate 10 may in fact be a well region of one conductivity type fabricated in a semiconductor substrate of an opposite conductivity type as is common in a CMOS process. Alternatively, lower electrode 12 may be a layer of doped polycrystalline silicon located over a silicon substrate. It should be noted that lower electrode 12 of the antifuse device is heavily doped using a dopant which will create a semiconductor conductivity type opposite in polarity to that of the substrate 10. Therefore, if substrate 10 is P-type material, lower electrode 12 should be a heavily doped N-type diffusion region and vice versa. In the preferred embodiment, the bottom electrode 12 comprises N+ material such as arsenic or phosphorus having a dopant concentration of from $1 \times 10^{19}$ to $1 \times 10^{21}$ cm$^3$. Lower electrode 12 may be implanted in substrate 10 by any of the known methods for creating such regions.

The surface of lower electrode 12 is oxidized in accordance with known techniques to form a silicon dioxide layer 16. Silicon dioxide layer 16 can be a layer of thermally grown silicon dioxide. In a presently preferred embodiment, this layer may be from about 25 to 1,000 Å thick. A silicon nitride layer 18 is then formed over silicon dioxide layer 16. Silicon nitride layer 18 is formed in accordance with well known techniques and may have a thickness of from about 50 to 1,000 angstroms.

In accordance with one aspect of the invention, conventional photolithographic techniques are used to form a photoresist pad 20 over the silicon nitride layer 18 covering lower electrode 12 at a point where it is decided to form an aperture for the antifuse. The silicon nitride layer 18 is then isotropically etched, using the photoresist pad as a mask. Those of ordinary skill in the art will recognize that the size of the photoresist pad determines the size of the aperture to be created using the process of the present invention. If the photresist pad is formed to the minimum feature size possible, the resulting aperture will have a size smaller than that minimum feature size.

Referring now to FIG. 1b, a silicon nitride pad 22 remains after isotropic etching of the silicon nitride and removal of the photoresist pad 20. It will be appreciated that, in accordance with one aspect of the present invention, the photoresist pad 20 is smaller than the overlying pattern which was used to form it. Similarly, as those experienced in photolithography processes will appreciate, silicon nitride pad 22 is even smaller than the overlying resist pad 20 after it is defined by the isotropic etch due to undercutting beneath the resist pad 20. Thus, characteristics of photolithography which are deemed detrimental in the prior art such as etchant encroachment and undercutting of the resist pad are actually used advantageously in the present invention to produce a minimum size aperture smaller than can be achieved by a conventional photolithographic feature size as will be further explained.

The wafer is then further oxidized to provide a thick field silicon dioxide 24 which is thicker than normal, and may even approach the thickness of field oxide region 14. In accordance with one aspect of the invention, the silicon dioxide 14 could easily be three times thicker than normal, and may have a thickness in a range of from about 1,000 to 5,000 angstroms. Such a thick field silicon dioxide layer 24 advantageously reduces the parasitic capacitance of an antifuse formed therein by a factor of at least three times over the prior art. The oxidation process causes the silicon dioxide to encroach underneath the silicon nitride pad 22. The silicon nitride pad 22 is stripped off by conventional methods, leaving a small aperture at region 26 in FIG. 1b. In accordance with the present invention, the bird's beak encroachment at region 26 further reduces the diameter of the antifuse dielectric over the aperture previously defined by silicon dioxide layer 16 in FIG. 1a.

Referring now to FIG. 1c, the antifuse structure may be completed by forming an upper electrode 28 as is known in the art.

It will be appreciated that the method according to the present invention is capable of producing an opening in the silicon dioxide layer on the order of 0.1 microns by 0.1 microns (0.01 square microns or) smaller. The standard method of etching an aperture in the silicon dioxide layer would result in an opening on the order of 1.1 microns by 1.1 microns (1.21 square microns). Thus, the method according to the present invention reduces the size of the aperture by at least 100 fold over standard photolithographic process sequence. Because capacitance is directly proportional to the area of the dielectric, the present invention advantageously is able to reduce the capacitance of a single antifuse element by at least 100 fold. In addition, because the field silicon dioxide 14 can also be made three times as thick, the field silicon dioxide capacitance of an antifuse produced in accordance with this invention is advantageously reduced by at least a factor of three.

Figure 2A:
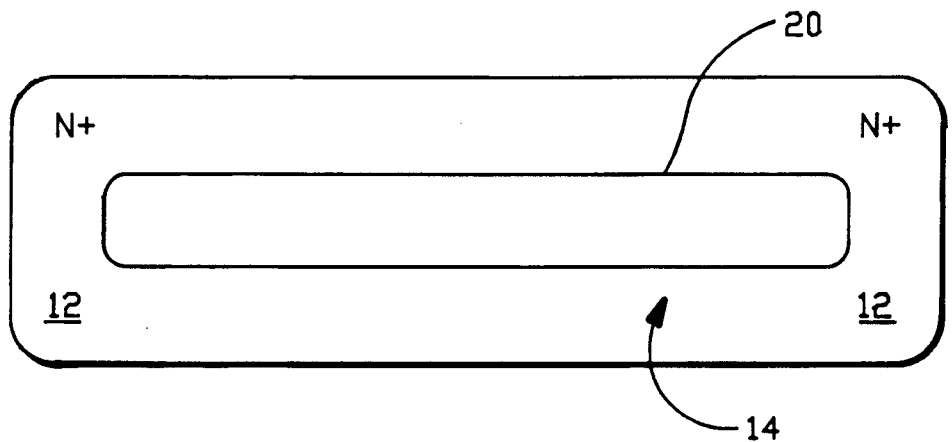
FIGS. 2a and 2b are top views of a two mask process in accordance with the present invention whereby two intersecting masking strips are used to prevent the breaking of the minimum geometry photo resist.
Figure 2B:
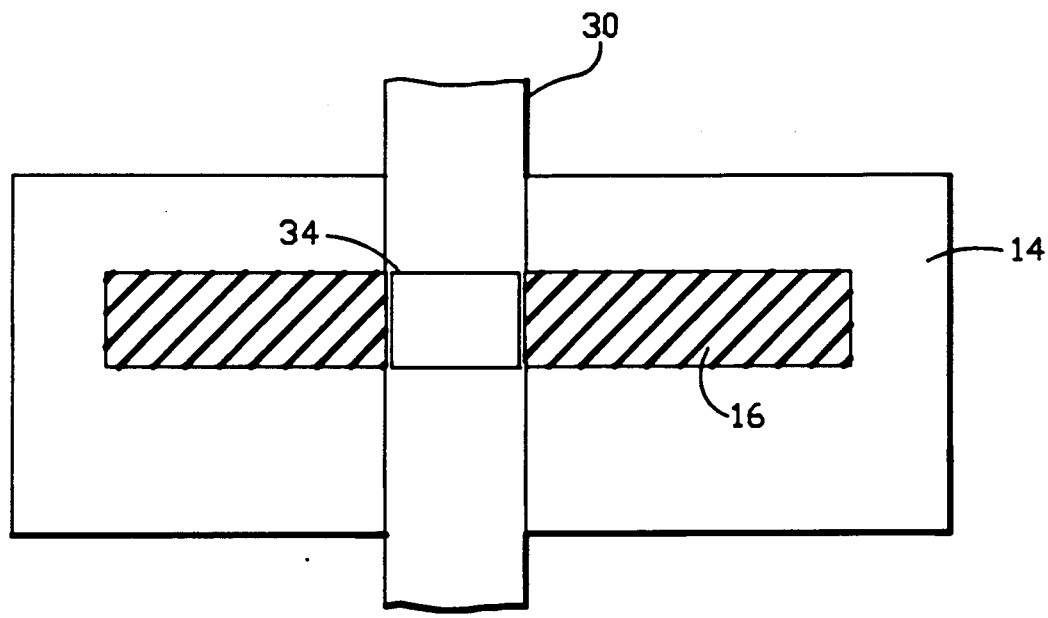

Referring now to FIGS. 2a and 2b, a method is shown for enabling extremely small photoresist features to remain adhered to an antifuse device during processing by using a two step mask process. If minimum feature size photoresist pads are used, their small size may make them subject to being easily broken or otherwise falling off the device during processing. In accordance with this aspect of the invention, a two step mask process may be used as shown in FIGS. 2a and 2b. In a first step as shown in FIG. 2a, an elongate strip of silicon nitride 30 is formed on substrate 32 in accordance with known techniques. Strip 30 may have a width of approximately 0.8 microns. Its length may be as long as necessary to form other antifuse elements if desired. A layer of silicon dioxide, which may have a thickness of approximately 3000 Å, is then grown on the unmasked portions of the silicon surface surrounding silicon nitride strip 30.

Referring to FIG. 2b, next, a second strip of silicon nitride 34 having a width comparable to strip 30 is deposited in accordance with known techniques such that it orthogonally intersects the first silicon nitride strip 30. The intersection 36 of the two silicon nitride masks effectively produces a silicon nitride pad having a cross section of approximately 0.8 microns × 0.8 microns.

It will be appreciated that the elongate, intersecting strips of resist provide a greater surface area for adhesion and are not nearly as susceptible (as is a tiny resist pad) to breaking or falling off during etching operations. After processing, this cross sectional area shrinks as described previously to approximately 0.7 × 0.7 microns. After isotropic etching and encroachment oxidation as previously described, the final antifuse opening may have a dimension of as small as approximately 0.5 microns or less.

In accordance with another aspect of the invention, a method of reducing the size of an antifuse aperture uses undercutting which is inherent in isotropic plasma etching techniques or hot phosphorous wet etching techniques. As explained previously, conventional etching processes have not been utilized for reducing the dimensions of features to be defined on an integrated circuit. One of the major limitations of a prior art photolithographic process sequence is that an isotropic plasma etch proceeds laterally underneath the masking layer as well as vertically toward the silicon surface. Thus, in the prior art the etched features are generally larger than the dimensions on the mask. The present invention makes use of these perceived disadvantages in order to advantageously produce an aperture for an antifuse which is smaller than the minimum photolithographic feature size.

Figure 3A:
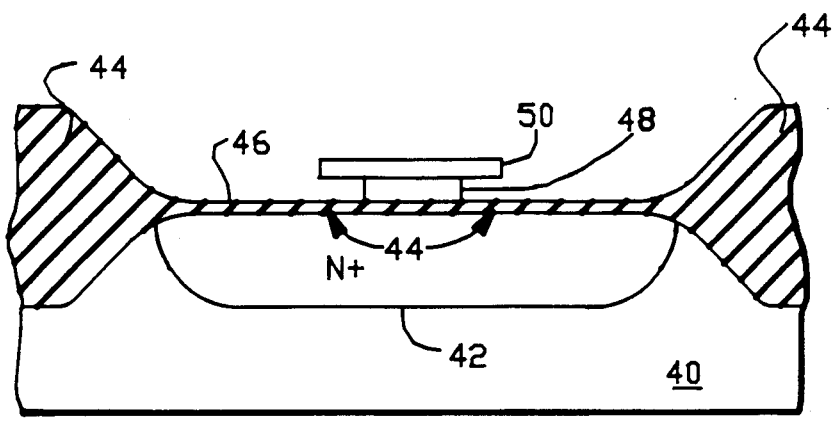
FIGS. 3a and 3b are side sectional views of an alternate embodiment of the device of FIG. 1 shown at various stages of its fabrication.

Referring first to FIG. 3a, silicon substrate 40 is implanted with N+ region 42 in between conventional field oxide regions 44. Alternatively, region 42 may be a layer of doped polysilicon. A layer of silicon dioxide 46 is grown on the surface of the silicon substrate and a silicon nitride layer 48 is formed on top of oxide layer 46. A masking oxide layer 50 is formed over silicon nitride layer 48. Silicon nitride layer 48 is then isotropically etched underneath the masking silicon dioxide layer 50 using either an isotropic plasma etch or hot phosphoric wet etch. This causes the silicon nitride layer 48 to be reduced to a size smaller than the masking oxide layer 50 as shown diagrammatically in FIG. 3a. For example, a masking silicon dioxide layer 50 having an area of 0.7 microns × 0.7 microns is typically undercut by isotropic plasma etching or hot phosphoric wet etching by about 0.3 microns. This would yield a silicon nitride pad 48 having an area of approximately 0.4 micron × 0.4 micron or less.

Figure 3B:
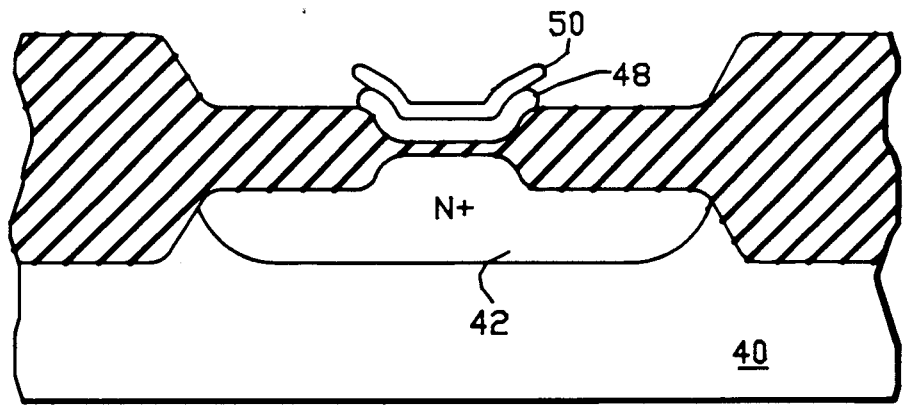
Figure 3C:
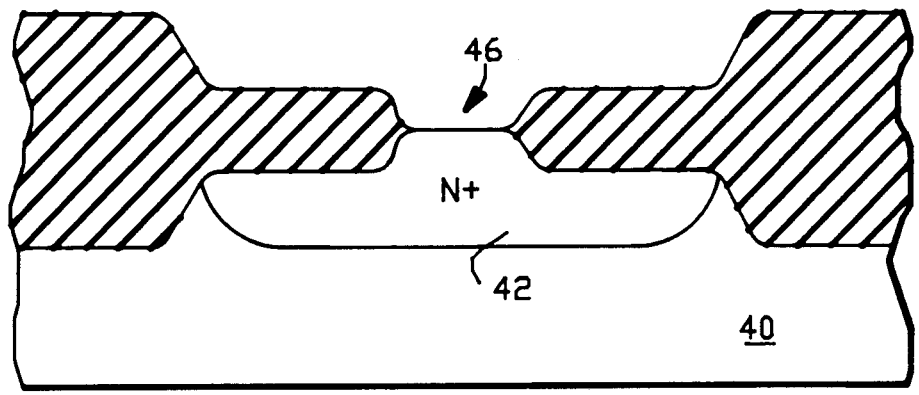

Next, a second field oxide layer 52 is grown, using the reduced size silicon nitride pad as a mask, as described in the previous embodiment. The silicon nitride pad 48 and the remaining portion of silicon dioxide layer 44 underneath it may be removed using conventional processing techniques, leaving a small antifuse aperture 54 as shown in FIG. 3b. Aperture 54 may be less than or equal to approximately 0.1 micron × 0.1 micron in size. Note that the above-described process could also be accomplished using the additional masking step shown in FIGS. 2a and 2b.

Figure 4A:
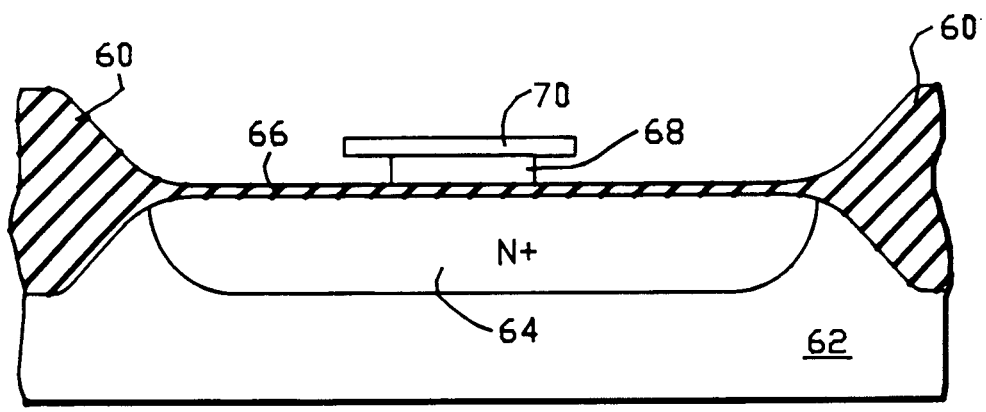
FIGS. 4a, 4b and 4c are side sectional views of an alternate embodiment of the device of FIG. 1 at various stages of its fabrication.

Another embodiment of the present invention comprises another method for forming a minimum size antifuse aperture using superadjacent layers of silicon nitride and polycrystalline silicon. Referring now to FIG. 4a, using conventional techniques, a conventional thick field oxide 60 is grown on the surface of a semiconductor substrate 62 except in the region where the antifuse is to be formed. An N+ diffusion region 64 is conventionally formed in semiconductor substrate 60. A silicon dioxide layer 66 is grown over the diffusion region 64. In a presently preferred embodiment, silicon dioxide layer 66 may have a thickness of about 1,000 angstroms.

A layer of polycrystalline silicon 68 is formed over silicon dioxide layer 66 using well known processing techniques. A silicon nitride masking layer 70 is formed over the polycrystalline silicon layer 68 using well known techniques. The size of the antifuse aperture will depend on the size of the silicon nitride masking layer 70.

Next, using an isotropic plasma etch or conventional wet etching techniques, the stacked silicon nitride polycrystalline silicon structure is isotropically etched resulting in the undercut structure shown in FIG. 4a.

Figure 4B:
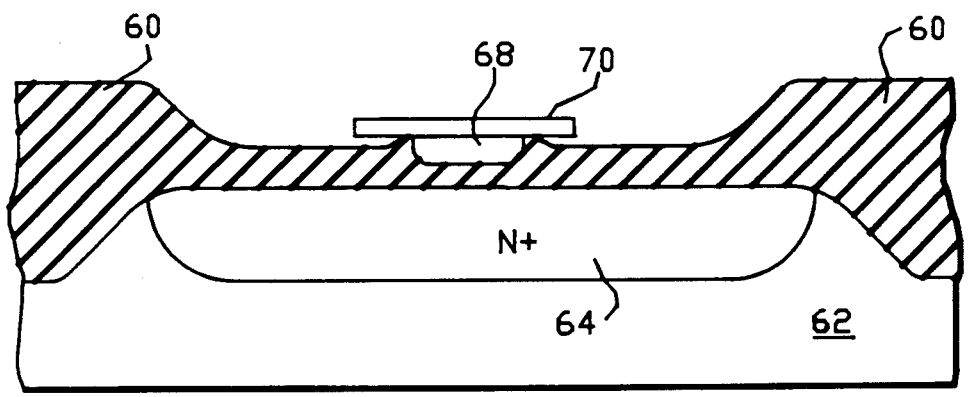

Referring to 4b, the wafer is oxidized using the stacked structure as a mask, forming a thicker field oxide layer 72 over the N+ region 64 which encroaches upon the portion of silicon dioxide layer 66 under polysilicon layer 68. The growth of field silicon dioxide 72 proceeds up the sides of polysilicon layer 68 as shown in FIG. 4b.

Figure 4C:
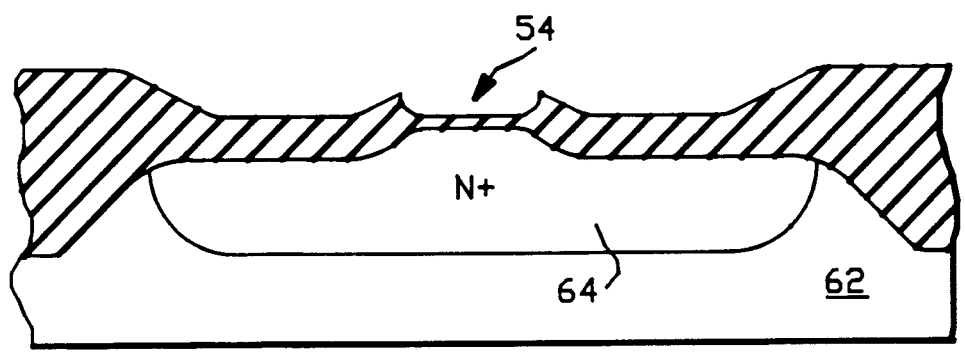

Referring to FIG. 4c, the silicon nitride masking layer 70 and polysilicon layer 68 are then removed in accordance with conventional etching techniques. The exposed silicon dioxide layer 66 is then dipped out with a suitable etchant leaving aperture 74. Aperture 74 may have an area as small as approximately 0.01 square microns or less and advantageously forms the location of an antifuse element having reduced capacitance. The foregoing method could also be accomplished using intersecting strips of silicon nitride for the silicon nitride masking layer 70 as shown in FIGS. 2a and 2b.

Figure 5:
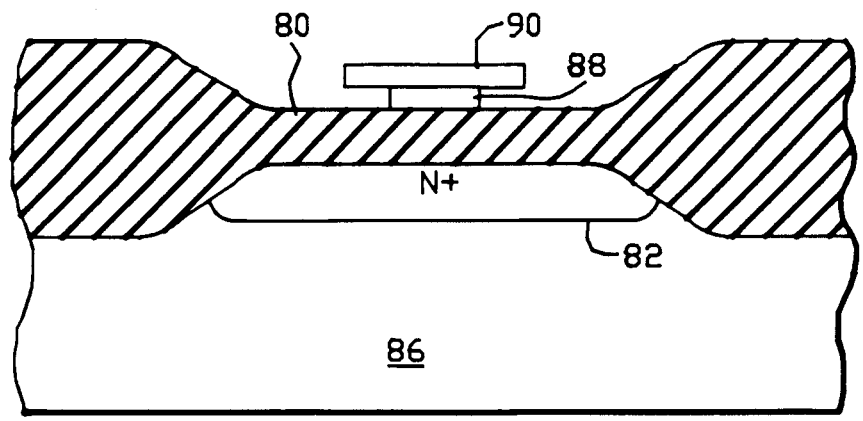
FIGS. 5a and 5b are side sectional views of an alternate embodiment of the device of FIG. 1 at two stages in its fabrication.

Referring now to FIG. 5, an alternate embodiment of the present invention provides a minimum size aperture for forming an antifuse element having reduced capacitance by utilizing a negative resist. In accordance with previous teachings of the invention, a layer of silicon dioxide 80 is formed over N+ region 82 (which may be an implanted region in a silicon substrate or a layer of doped polysilicon) in between field oxide regions 84 in silicon substrate 86. In a presently preferred embodiment, silicon dioxide layer 80 may have a thickness of approximately 1000 Å.

A layer of negative resist 88 is placed on the surface of the wafer using well known techniques. In a preferred embodiment, the layer of negative resist 88 may be covered with aluminum layer 90, formed using conventional techniques. A layer of positive resist (not shown) is patterned on top of the aluminum layer 90 in the region where the antifuse is to be formed. Using the layer of positive resist as a mask, aluminum layer 90 is etched. Negative resist layer 88 is then isotropically plasma etched as shown to leave a small area of negative resist 88 over silicon dioxide layer 80. The negative resist 88 under the aluminum masking layer 90 is undercut due to the isotropic action of the etching process, resulting in a negative resist feature smaller than the overlying aluminum layer 90. The aluminum layer may then be removed using a standard aluminum etch. Next, as is known in the art, anhydrous HF at a temperature of approximately 180° centigrade may be used to cause negative resist 88 to etch oxide layer 80 to form an aperture to be opened in silicon dioxide layer 80. The resulting aperture may have an area as small as 0.01 micron or less.

It will be appreciated that the use of a negative resist in accordance with the teachings of the present invention for making a minimum sized aperture is a significant departure from the prior art. Formerly, negative resists were disfavored because of lower resolution. Negative resists are used in the prior art to make apertures larger than an overlying mask pattern. In the present invention, a negative resist is used to form a feature smaller than the negative resist pattern.

Figure 6A:
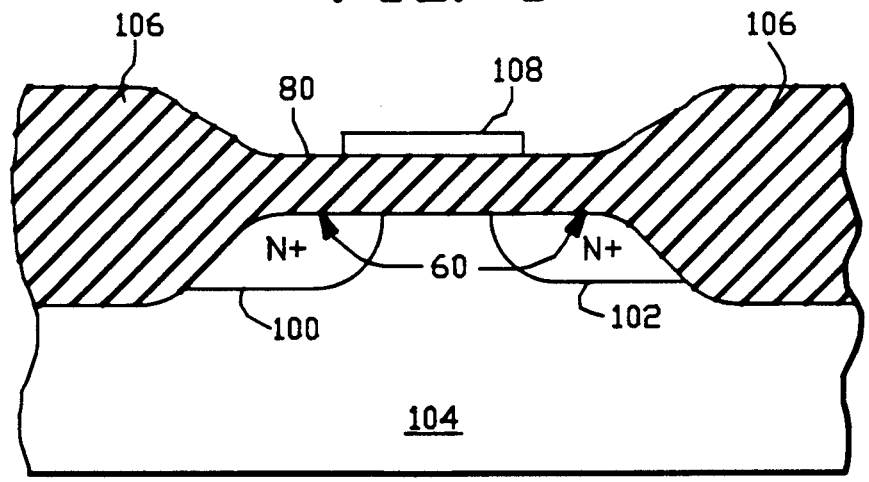
FIGS. 6a and 6b are side sectional views of an alternate embodiment of the device of FIG. 1 at various stages of its fabrication.

In accordance with another embodiment of the invention, a method of forming an antifuse aperture uses enhanced N+ oxidation. Referring first to FIG. 6a, two N+ regions 100 and 102 are implanted into silicon substrate 104 in accordance with well known ion implantation or diffusion techniques using field oxide regions 106 and masking layer 108 as masks, leaving a space 110 between regions 100 and 102. Those of ordinary skill in the art will recognize that the size of the mask will determine the size of the spacing, which will determine the size of the antifuse aperture to be formed. The N+ regions 100 and 102 may be thermally driven under the edges of mask 108, reducing the size of space 110. Mask 108 is then removed.

Next, an oxidation step may be performed using a well known low temperature steam process. Because the heavily doped N+ regions 100 and 102 will oxidize more rapidly than does the portion of lightly doped or undoped silicon substrate 104 in the space 110, the resulting oxide is thinner over space 110, the region in which the antifuse aperture is formed.

Figure 6B:
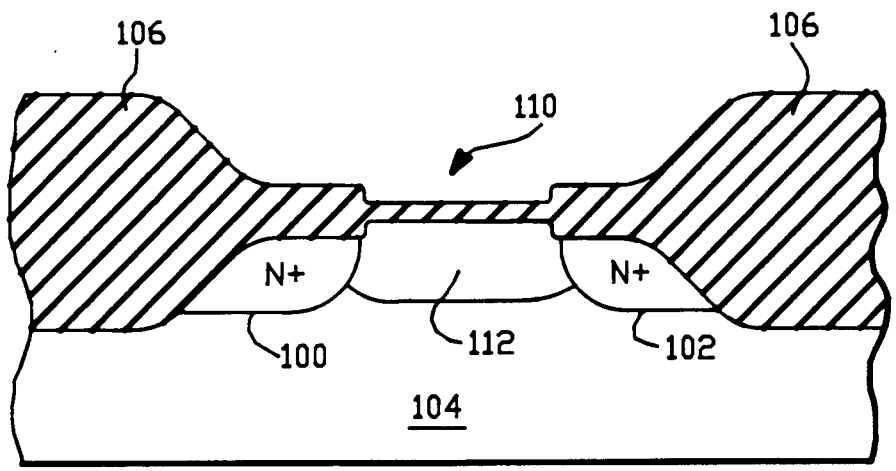

The resulting structure after performance of the oxidation step is shown in FIG. 6b. At this point, an additional N+ region 112 may be implanted into space 110 in order to form the lower electrode of the antifuse element.

Figure 7A:
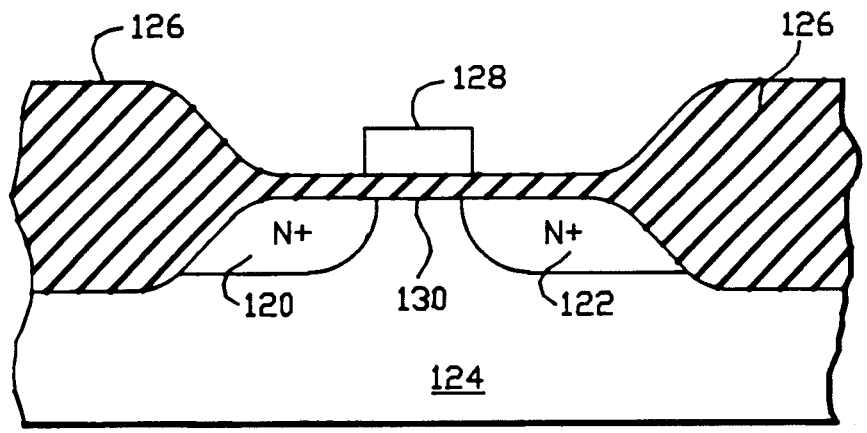
FIGS. 7a, 7b and 7c are side sectional views of an alternate embodiment of the device of FIG. 1 at various stages of its fabrication.
Figure 7B:
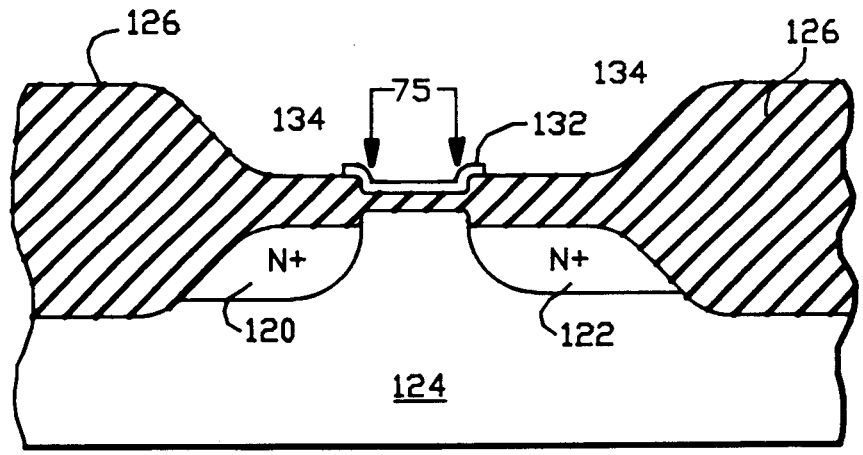
Figure 7C:
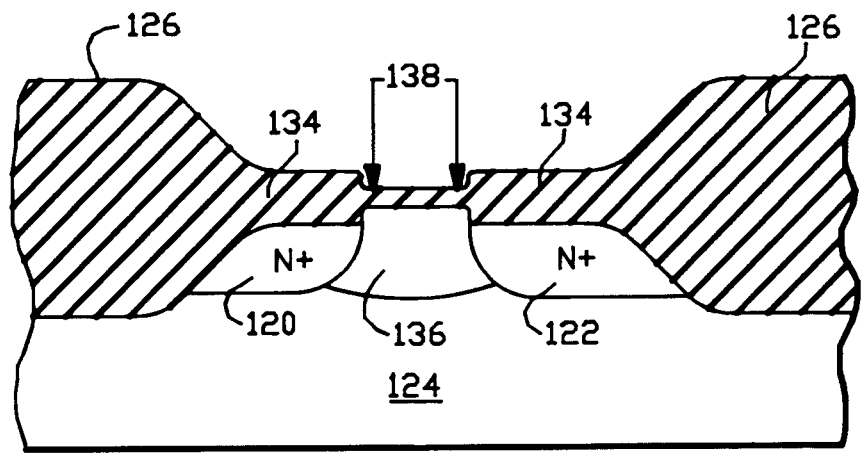

FIGS. 7a-7c show an alternate embodiment combining the previous methods to provide a sharpened transition from the aperture for the antifuse element to thick field oxide 14. This is advantageous in providing a more sharply delineated antifuse element which will have less area and less parasitic capacitance.

Referring to FIG. 7a, N+ regions 120 and 122 are formed in substrate 124 in between field oxide regions 126, using a masking layer 128 to form a space 130 between regions 120 and 122. Regions 120 and 122 may be laterally diffused to reduce the size of space 130.

Referring to FIG. 7b, a silicon nitride masking layer 132 is defined between the N+ regions 120 and 122 and additional field oxide 134 is grown in low temperature steam in accordance with conventional techniques and encroaches beneath silicon nitride layer 132. The presence of N+ regions 120 and 122 enhances the oxidation process. The silicon nitride layer 132 is then removed in accordance with conventional techniques which are well known to those skilled in the art as shown in FIG. 7c, leaving aperture 138.

Referring to FIG. 7c, an additional doped region 136 is implanted or diffused into the space 130 to form the N+ diffusion region 134 which functions as the lower electrode of the antifuse element.

While the invention has been described in connection with what is presently considered to be the most practical and preferred embodiments, it is to be understood that the invention is not limited to the disclosed embodiment but, on the contrary is intended to cover various modifications and equivalent arrangements included within the spirit and scope of the appended claims. For example, the conductivity types of the diffusion regions in the semiconductor substrate could be reversed. P+ diffusion regions could be substituted for the N+ diffusion regions shown in the drawings. Therefore, persons of ordinary skill in this field are to understand that all such equivalent structures are to be included within the scope of the following claims.

What is claimed is:

1. In an electrically programmable antifuse element including a dielectric layer between two conductive electrodes, one of said electrodes comprising an implanted region in a semiconductor substrate, a method for forming an antifuse aperture including the steps of:

forming a silicon dioxide layer over said implanted region, forming a silicon nitride pad over said silicon dioxide layer, exposing said semiconductor substrate to an oxidizing atmosphere to form an intermediate silicon dioxide layer such that the edges of said intermediate silicon dioxide layer encroach underneath the edges of said silicon nitride pad, removing said silicon nitride pad.

2. The method according to claim 1 wherein said step of forming a silicon nitride pad includes:

forming a first elongate silicon nitride strip disposed substantially over said implanted region, said first elongate silicon nitride strip having a width equal to the minimum feature size in the process technology used to produce it, forming a second elongate silicon nitride strip, said second elongate silicon nitride strip having a width equal to the minimum feature size in the process technology used to produce it, said second silicon nitride strip intersecting said first silicon nitride strip at a location where it is desired to create an antifuse.

3. In an electrically programmable antifuse element including a dielectric layer between two conductive electrodes, one of said electrodes comprising an implanted region in a semiconductor substrate, a method for forming an antifuse aperture including the steps of:

forming a thin silicon dioxide layer over said implanted region, forming a silicon nitride layer overlying said thin silicon dioxide layer, forming a silicon dioxide masking layer over said silicon nitride layer, isotropically etching said dioxide masking layer and said silicon nitride layer to form a silicon nitride pad having an area equal to less than that of said silicon dioxide masking layer, exposing said semiconductor substrate to an oxidizing atmosphere to form an intermediate silicon dioxide layer such that the edges of said intermediate silicon dioxide layer encroach underneath the edges of said silicon nitride pad, removing said silicon dioxide masking layer and said silicon nitride pad.

4. In an electrically programmable antifuse element including a dielectric layer between two conductive electrodes, one of said electrodes comprising an implanted region in a semiconductor substrate, a method for forming an antifuse aperture including the steps of:

forming a first thin silicon dioxide layer over said implanted region, forming a polycrystalline silicon layer over said thin silicon dioxide layer, said polycrystalline silicon layer having an area larger than the desired area of said antifuse, forming a silicon nitride pad over said polycrystalline silicon layer, said silicon nitride pad having an area approximately the same size as said polysilicon layer, isotropically etching said silicon nitride pad and said polycrystalline silicon layer, to form a polysilicon pad having an area equal to less than that of said silicon nitride pad, exposing said semiconductor substrate to an oxidizing atmosphere to form an intermediate silicon dioxide layer such that the edges of said intermediate silicon dioxide layer encroach underneath the edges of said polycrystalline silicon pad, removing said polycrystalline silicon pad and said silicon nitride pad.

5. The method according to claim 4 wherein said step of forming a silicon nitride pad includes:

forming a first elongate silicon nitride strip disposed substantially over said implanted region, said first elongate silicon nitride strip having a width equal to the minimum feature size in the process technology used to produce it, forming a second elongate silicon nitride strip, said second elongate silicon nitride strip having a width equal to the minimum feature size in the process technology used to produce it, said second silicon nitride strip intersecting said first silicon nitride strip at a location where it is desired to create an antifuse.

6. In an electrically programmable antifuse element including a dielectric layer between two conductive electrodes, one of said electrodes comprising an implanted region in a semiconductor substrate, a method for forming an antifuse aperture including the steps of:

forming a thin silicon dioxide layer having a thickness of 1000 angstroms or less over said implanted region, forming a layer of negative resist over said thin silicon dioxide layer, forming a metal pad over said negative resist layer, said pad having an area larger than the desired area of said antifuse, isotropically etching said metal pad and said negative resist, to form a negative resist pad having an area equal to less than that of said metal pad, and removing said remaining portions of said metal layer and said negative resist.

7. In an electrically programmable antifuse element including a dielectric layer between two conductive electrodes, one of said electrodes comprising an implanted region in a semiconductor substrate of a first conductivity type, a method for forming an antifuse aperture including the steps of:

providing a masking layer on the surface of said silicon dioxide layer over the area in which it is desired to form said antifuse, forming spaced apart regions of a second conductivity type in said semiconductor substrate, using said masking layer as a mask, exposing said semiconductor substrate to an oxidizing atmosphere to form an intermediate silicon dioxide layer, removing said masking layer.

* * * * *